United States Patent [19]
Newberg

[11] Patent Number: 5,444,564
[45] Date of Patent: Aug. 22, 1995

[54] OPTOELECTRONIC CONTROLLED RF MATCHING CIRCUIT

[75] Inventor: Irwin L. Newberg, Northridge, Calif.

[73] Assignee: Hughes Aircraft Company, Los Angeles, Calif.

[21] Appl. No.: 195,662

[22] Filed: Feb. 9, 1994

[51] Int. Cl.⁶ .............................................. H04B 10/04
[52] U.S. Cl. .................................... 359/187; 359/161; 333/32
[58] Field of Search ............... 359/187, 161, 111, 173; 333/32; 342/54; 343/860

[56] References Cited

U.S. PATENT DOCUMENTS 4,682,176 7/1987 Jones ..................................... 333/32
5,287,212 2/1994 Cox et al. ............................ 359/173

FOREIGN PATENT DOCUMENTS

0477952 4/1992 European Pat. Off. ............ 359/173

*Primary Examiner*—David K. Moore
*Assistant Examiner*—Kinfe-Michael Negash
*Attorney, Agent, or Firm*—Leonard A. Alkov; W. K. Denson-Low

[57] ABSTRACT

A photonic RF impedance matching system that includes an RF photonically controlled impedance matching circuit having adjustable impedance and power transfer characteristics, and feedback control circuitry for optically controlling the impedance matching circuit.

6 Claims, 5 Drawing Sheets

OPTOELECTRONIC CONTROLLED RF MATCHING CIRCUIT

BACKGROUND OF THE INVENTION

The subject invention is directed to fiber optic links for radar systems, and is directed more particularly to light controlled impedance matching techniques for microwave systems using optoelectronic feedback and control techniques.

In order to fully utilize the potential of advanced microwave systems with their vast data collection and processing capabilities, fast and very efficient data communication transfer systems must be utilized. RF fiber optic links utilizing optoelectronic components have the capability of meeting such communications requirements for several reasons. Fiber optic links are not susceptible to radio frequency noise and are capable of operating at very high data rates and at high radio frequencies without creating opportunities for interception and detection. The light weight and small size of fiber optic cables enables the use of highly redundant paths between units and provides for easier mechanical routing in corporate feeds of electronically scanned arrays, thus improving reliability and damage tolerance. Finally, the EMI immunity of fiber optics reduces equipment failures caused by electrical power transients and could also improve the capabilities and reduce the size and weight of radar and other avionic systems.

Typically, a fiber optic link includes a photonic transmitter responsive to an input RF signal for producing an RF amplitude modulated light signal. The modulated light signal is communicated via a fiber optic cable to a photonic photodiode detector receiver that produces an electrical RF output in response to the received modulated light.

A consideration with present fiber optic links is the typically high level of insertion loss introduced by a fiber optic link. A significant factor in the high level of insertion loss is the typical technique of providing broadband 50 ohm impedance matching at the RF input and RF output of the fiber optic link for compatibility with microwave circuits, usually by the addition of resistance. While such impedance matching provides for reduced reflections over a relatively broad bandwidth, it results in substantial power loss.

A further consideration with fiber optic links in general is the lack of consistency in the impedance characteristics of laser diodes utilized in photonic transmitters. There is also a lack of consistency in the impedance characteristics of the photodiodes utilized in photonic receivers, although to a lesser degree.

SUMMARY OF THE INVENTION

It would therefore be an advantage to provide an RF fiber optic link that provides for photonically controlled impedance matching.

Another advantage would be to provide an RF fiber optic link that provides for increased power transfer with photonically adjustable impedance matching circuitry.

A further advantage would be to provide a photonically controlled RF impedance matching technique that reduces insertion loss of fiber optic links.

The foregoing and other advantages are provided by the invention in a photonic RF impedance matching system that includes an RF photonically controlled impedance matching circuit having adjustable impedance and power transfer characteristics, and feedback control circuitry for optically controlling the impedance matching circuit.

BRIEF DESCRIPTION OF THE DRAWING

The advantages and features of the disclosed invention will readily be appreciated by persons skilled in the art from the following detailed description when read in conjunction with the drawing wherein.

DETAILED DESCRIPTION

In the following detailed description and in the several figures of the drawing, like elements are identified with like numerals.

The subject invention is generally directed to photonic RF feedback impedance matching circuitry for RF optical and electrical circuits. In accordance with the invention, a feedback signal, which can be electrical or optical, is derived from the output of the RF circuit being input matched or from the output of a photonically controlled impedance matching circuit in the case of output matching, and is processed with an input signal to the circuit being matched to determine a optical correction signal that controls a controllable impedance matching circuit that includes components responsive to the optical correction signal.

Figure 1:
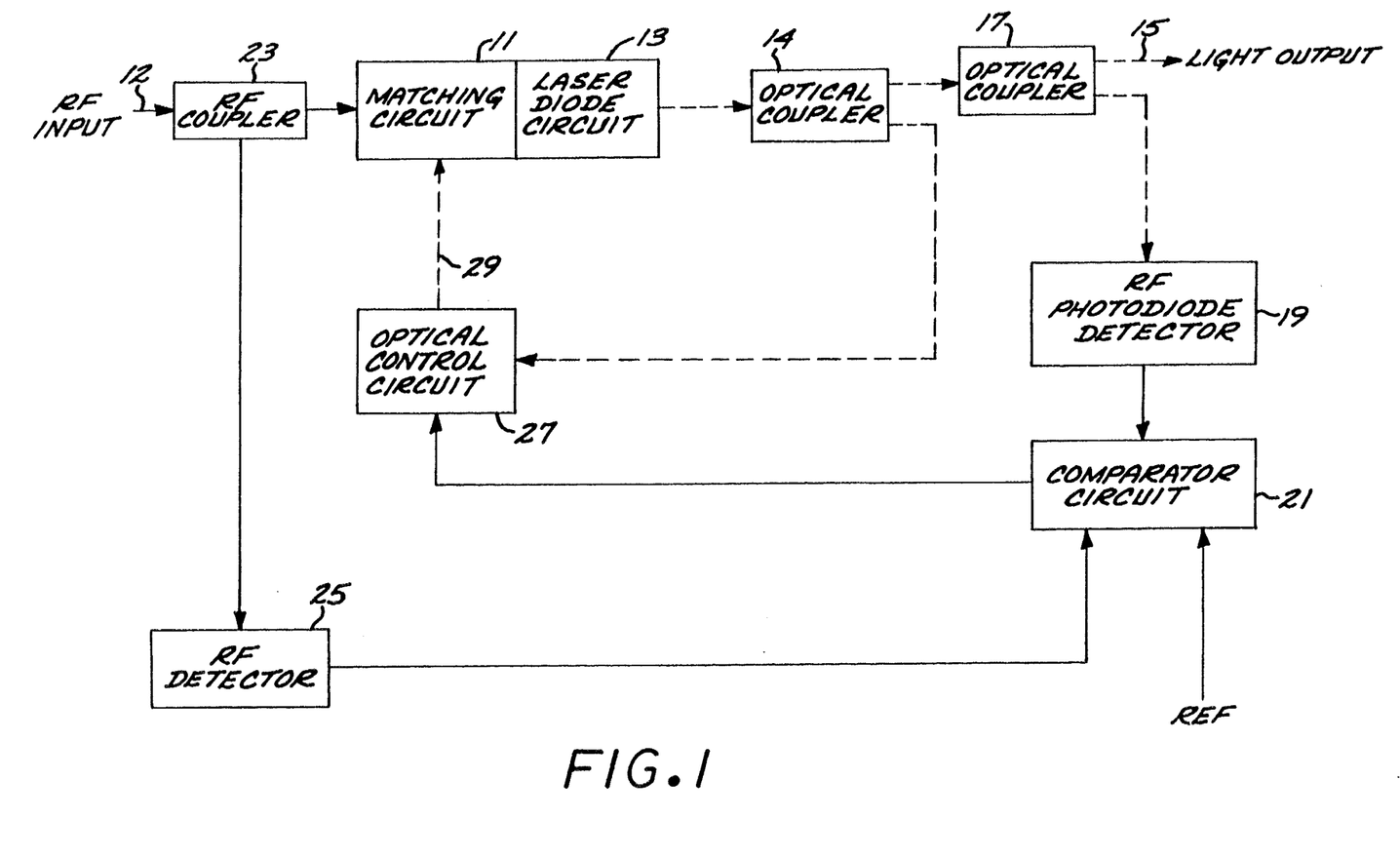
FIG. 1 is a schematic block diagram of an example of a photonic impedance matching system in accordance with the invention for matching the input of a laser diode circuit.

Referring now to FIG. 1, schematically depicted therein is an impedance matching system in accordance with the invention for matching the input of a laser diode circuit 13 which provides an optical output signal that is coupled to a fiber optic cable 15. For example, the laser diode circuit 13 comprises a transmitter for a fiber optic link. The impedance matching system includes an optoelectronic RF matching circuit 11 that receives an RF input signal on an RF input line 12 from an RF source (not shown) and transfers the RF input signal to the laser diode circuit 13. The RF matching circuit 11 and the laser diode circuit 13 are implemented on the same substrate so as to minimize the distance between the matching circuit and the laser diode circuit for which matching is being provided.

A first optical coupler 17 on the fiber optic cable 15 provides a sample of the optical output of the laser diode circuit 13 to an RF photodiode detector 19 which provides a variable output reference signal indicative of RF power of the optical output of the laser diode circuit 13. The output of the RF photodiode detector 19 is provided to a comparator circuit 21 which also receives an electrical reference signal REF as an input. An RF coupler 23 on the RF input line 12 to the matching circuit 11 provides a sample of the RF input signal to an RF detector 25 whose output comprises a variable input reference signal indicative of the RF power of the RF electrical signal input to the laser diode circuit 13. The variable input reference signal provided by the RF detector 25 is provided as another input to the comparator circuit 21.

In accordance with known techniques, the comparator circuit normalizes the output reference signal relative to the input reference signal, and compares such normalized output reference signal to the reference signal REF which is of the desired normalized power output, such as the maximum normalized power output. Pursuant to such comparison, the comparator circuit produces a control signal that is provided to an optical control circuit 27 which receives a sample of the laser diode circuit output from a second optical coupler 14 on the fiber optic cable 15. The optical control circuit 27 produces a light control signal output which varies in response to the control signal output of the comparator circuit 21. The light control signal output of the optical control circuit 27 is provided via a fiber optic cable 29 to the optoelectronic matching circuit 151 which changes its impedance in response to the light control signal provided thereto.

In operation, the optoelectronic matching circuit 11 and related components comprise a broad bandwidth microwave impedance matching system that provides input impedance matching for the laser diode circuit. Lasers are very broad bandwidth, typically from DC to about 10 GHz, and thus very broad bandwidth impedance matching is desirable. Impedance matching is achieved by using a feedback technique to correct the input match via light control of the optoelectronic RF matching circuit 11 which changes impedance in response to the light control signal. The light control signal is obtained by coupling a light sample from the laser diode circuit light output to the RF photodiode detector that provides the variable output reference signal which comprises an electrical sample of the RF signal modulated onto the laser light output. This variable output reference signal is normalized relative to the variable input reference signal which comprises an electrical sample of the RF input signal to the laser diode circuit and is provided by the RF coupler and RF detector. The normalized output reference signal is compared with the electrical reference signal REF used to establish the predicted maximum power output level for the general class of laser diodes as utilized in the laser diode circuit. The control signal provided by the comparator circuit (a general type circuit known in the art) controls the optical circuit which can be an external modulator or any type of optoelectric circuit that can control an input light level amplitude via an electrical input. The optical control circuit receives its light input from the second light coupler, and the variable light signal out of the optical control circuit interacts with the impedance matching circuit to obtain a broad bandwidth match.

Figure 2:
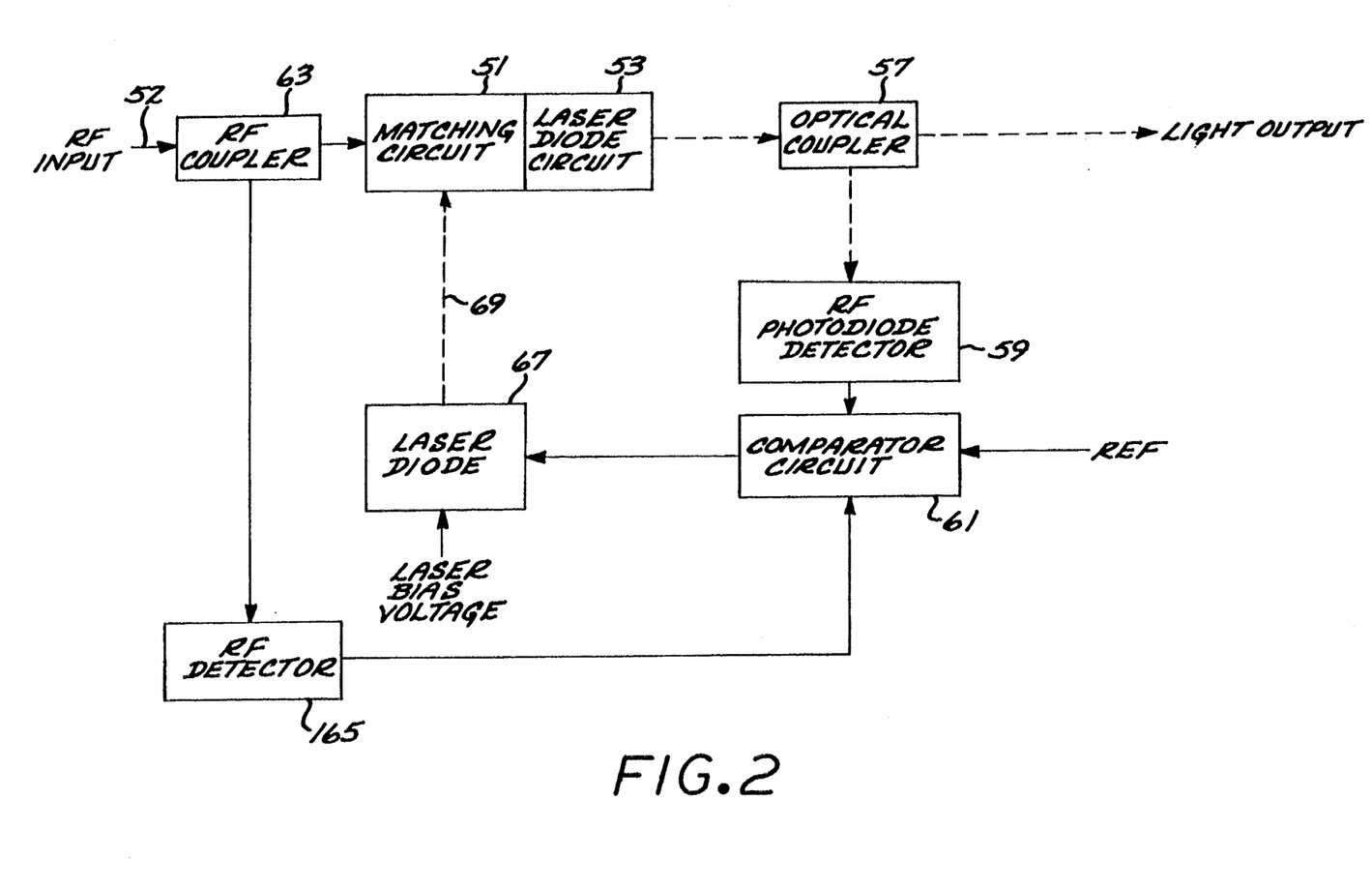
FIG. 2 is a schematic block diagram of a further example of a photonic impedance matching system in accordance with the invention for matching the input of a laser diode circuit.

Referring now to FIG. 2, schematically depicted therein is an impedance matching system in accordance with the invention for matching the input of a laser diode circuit 53 which provides an optical output signal that is coupled to a fiber optic cable 55. For example, the laser diode circuit 53 comprises a transmitter for a fiber optic link. The impedance matching system includes an optoelectronic RF matching circuit 51 that receives an RF input signal on an RF input line 52 from an RF source (not shown) and transfers the RF input signal to the laser diode circuit 53. The RF matching circuit 51 and the laser diode circuit 53 are implemented on the same substrate so as to minimize the distance between the matching circuit and the laser diode circuit for which matching is being provided.

An optical coupler 57 on the fiber optic cable 55 provides a sample of the optical output of the laser diode circuit 53 to an RF photodiode detector 59 which provides a variable output reference signal indicative of RF power of the optical output of the laser diode circuit 53. The output of the RF photodiode detector 59 is provided to a comparator circuit 61 which also receives an electrical reference signal REF as an input. An RF coupler 63 on the RF input line 52 to the matching circuit 51 provides a sample of the RF input signal to an RF detector 65 which provides a variable input reference signal indicative of the RF power of the RF electrical signal input to the laser diode circuit 53. The variable input reference signal is provided as another input to the comparator circuit 21.

In accordance with known techniques, the comparator circuit normalizes the output reference signal relative to the input reference signal, and compares such normalized output reference signal to the reference signal REF which is of the desired normalized power output, such as the maximum normalized power output. Pursuant to such comparison, the comparator circuit produces a control signal that is provided to a laser diode circuit 67 which is biased by a DC bias voltage. The laser diode circuit 67 produces a control light output which varies in response to the control signal output of the comparator circuit 61. The control light output of the laser diode circuit 67 is provided via a fiber optic cable 69 to the optoelectronic matching circuit 51 which changes its impedance in response to the control light provided thereto.

The impedance matching system of FIG. 2 operates similarly to the impedance matching system of FIG. 1, except that the control light for the optoelectronic matching circuit is provided by a laser diode circuit light output rather than by a modulated sample of the output of the laser diode circuit whose input is being matched.

Figure 3:
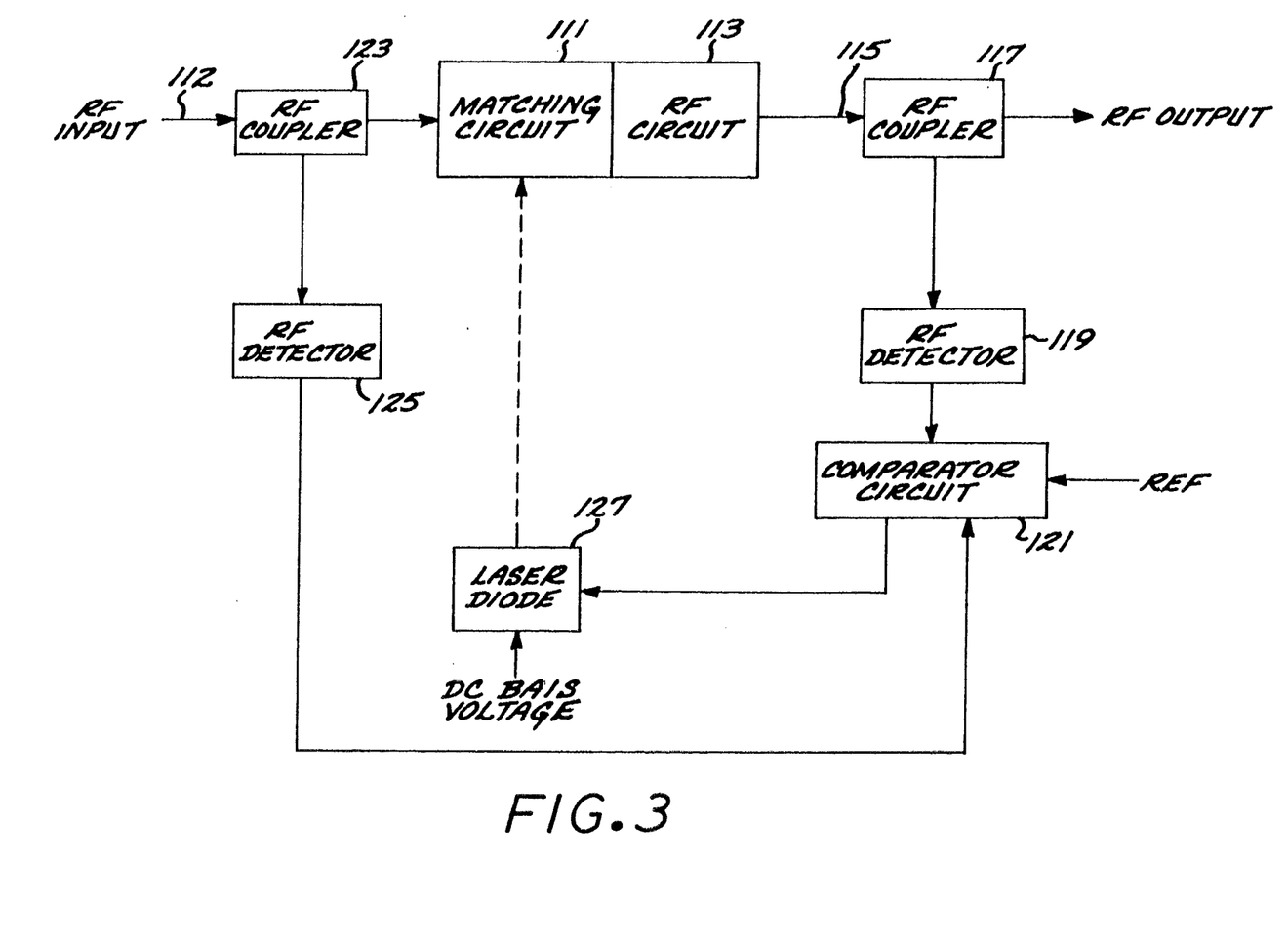
FIG. 3 is a schematic block diagram of an example of a photonic impedance matching system in accordance with the invention for matching the input of an RF circuit.

Referring now to FIG. 3, schematically depicted therein is an impedance matching system in accordance with the invention for matching the input of an RF circuit 113 such as an FET amplifier which provides an electrical RF output on an RF output line 115. The impedance matching system includes an optoelectronic RF matching circuit 111 that receives an RF input signal on an RF input line 112 from an RF source (not shown) and transfers the RF input signal to the RF circuit 113. The RF matching circuit 111 and the RF circuit 113 are implemented on the same substrate so as to minimize the distance between the matching circuit and the RF circuit for which matching is being provided.

An RF coupler 117 on the RF output line 115 provides a sample of the electrical RF output of the RF circuit 113 to an RF detector 119 which provides a variable output reference signal indicative of the RF power of the electrical output of the RF circuit 113.

The output of the RF detector 59 is provided to a comparator circuit 121 which also receives an electrical reference signal REF as an input. An RF coupler 123 on the RF input line 112 to the matching circuit 111 provides a sample of the RF input signal to an RF detector 125 which provides a variable input reference signal indicative of the RF power of the RF electrical signal input to the RF circuit 113. The input reference signal is provided as another input to the comparator circuit 121.

The comparator circuit 121 provides a control signal to a laser diode circuit 127 which is biased by a DC bias voltage. The laser diode circuit 127 produces a control light output which varies in response to the control signal output of the comparator circuit 121. The control light output of the laser diode circuit 127 is provided via a fiber optic cable 129 to the optoelectronic matching circuit 111 which changes impedance in response to the control light provided thereto.

The feedback impedance matching system of FIG. 3 operates similarly to the impedance matching system of FIG. 2, except that an electrical RF circuit is being matched instead of a laser diode circuit, and thus a sample of an electrical RF output is utilized as an input to the comparator instead of a sample of an RF modulated light output.

Figure 4:
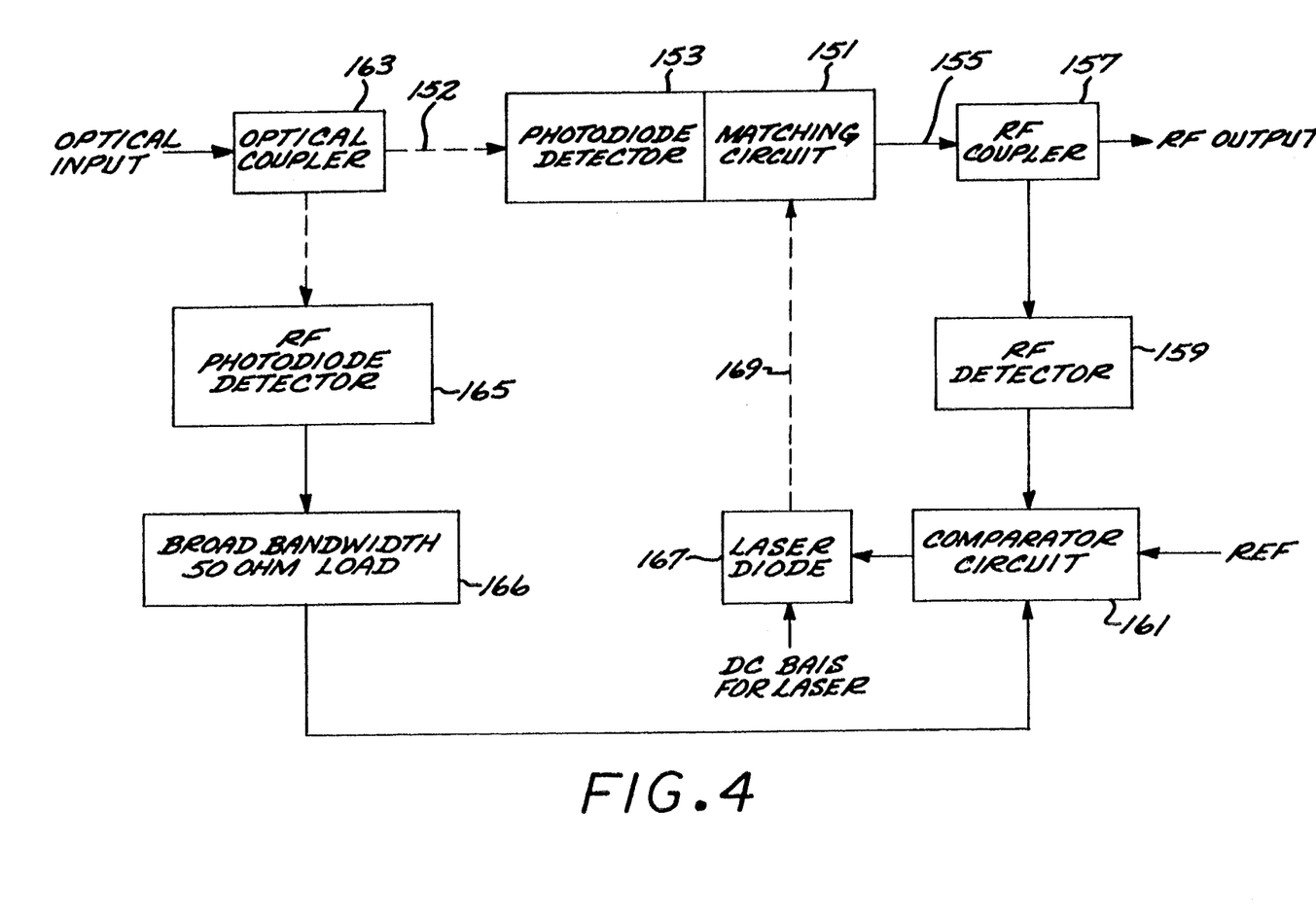
FIG. 4 is a schematic block diagram of an example of a photonic impedance matching system in accordance with the invention for matching the output of an optical detector circuit.

Referring now to FIG. 4, schematically depicted therein is an impedance matching system in accordance with the invention for impedance matching the output of an RF photodiode detector 153 which receives an RF modulated input optical signal via a fiber optic cable 152. The output impedance matching system includes an optoelectronic RF matching circuit 151 that receives an RF signal from the RF photodiode detector 153 and provides RF matching circuit output signal on an RF output line 155. The RF photodiode detector 153 and the matching circuit 151 are implemented on the same substrate so as to minimize the distance between the matching circuit and the RF photodiode detector for which output matching is being provided.

An RF coupler 157 on the RF output line 155 provides a sample of the electrical RF output of the optoelectronic matching circuit 151 to an RF detector 159 which provides a variable output reference signal indicative of the RF power of the electrical output of the optoelectronic matching circuit. The output of the RF detector 159 is provided to a comparator circuit 161 which also receives an electrical reference signal REF as an input. An optical coupler 163 on the optical fiber cable input 152 to the photodiode detector 153 provides a sample of the optical input signal to an RF photodiode detector 165 which provides an electrical output to a broad bandwidth 50 ohm load 166 whose output comprises a variable input reference signal that is indicative of the RF power of the RF electrical signal input to the RF power of the optical signal input to the RF photodiode detector. The variable input reference signal is provided as another input to the comparator circuit 161.

The comparator circuit 161 provides a control signal to a laser diode circuit 167 which is biased by a DC bias voltage. The laser diode circuit 167 produces a control light output which varies in response to the control signal output of the comparator circuit 161. The control light output of the laser diode circuit 167 is provided via a fiber optic cable 169 to the optoelectronic matching circuit 151 which changes impedance in response to the control light provided thereto.

The feedback impedance matching system of FIG. 4 operates similarly to the impedance matching system of FIG. 3, except that output matching is being provided and the reference input signal to the comparator circuit is obtained from an optical coupler on the fiber optic cable input to the photodetector whose output is being matched. The optical signal from the optical coupler is transformed to an RF electrical signal by an RF photodiode detector whose output is provided to the 50 ohm load which provides to the comparator circuit a variable input reference signal that comprises a broadband electrical sample of the RF optical signal input to the RF photodiode detector whose output is being matched.

In accordance with the invention, the matching circuits comprise active circuitry whose impedance matching characteristics are adjusted and controlled by optical signals so as to provide for impedance matching (i.e., reduced reflections) and increased power transfer as compared to the conventional 50 ohm broadband impedance matching. Such circuitry provides the capability of compensating variations as to design and manufacturing process of the components being matched, and also the capability of changing the match for different operating frequencies while providing for increased power transfer.

The use of active impedance matching circuits having photonically controllable impedance matching and power transfer characteristics permits for adjustment of the matching circuits for impedance matching optimization, power transfer optimization, as well as changes and comparisons, while maintaining the same RF circuit configuration. The active matching circuit can be used for input match or output matching over a desired frequency range centered at a preselected operating frequency. This covers the condition where the intended frequency range of use is known and the active match is used to account for the differences in the impedance parameters of the circuitry being matched. The active matching could also be used over a large frequency range by tuning the active match as the system operating frequency is changed. This covers the case where it is needed to change the impedance match in the course of operation in a system where the input frequency changes.

Power transfer is increased between the signal source and the load when impedance matching is used: (1) to make the reactance of the load equal and opposite to that of the signal source; and (2) to make the resistive component of the load equal to the resistive component of the signal source. This condition is referred to as a "conjugate match." When the above conditions are met, then maximum signal source power is transferred to the load. The matching circuit is typically tuned to the particular operating frequency since most matching is relatively narrow bandwidth. To the extent that the matching circuits can be made broadband, the match will be good over that frequency range. Thus, one parameter or set of parameters would be to meet the conjugate match condition over as wide a frequency range as possible. One way to help provide a wide bandwidth match is to have the signal source as close in distance as possible to the load. Close in this case would mean less than one-eighth of a wavelength at the highest operating frequency. Also, as the frequency is increased, distributed matching elements should be used rather than lumped elements. The matching devices and connecting transmission line should have minimum losses. Any loss in the matching circuit will reduce the power transferred to the load.

Several different matching networks can be configured by using inductors and capacitors in combination, including a "Tee" network wherein the "arms" of the "Tee" are inductors and the center leg is a capacitor to ground. The capacitor to ground could be a varactor diode which has a variable capacity that can be photonically "tuned" to different values. Thus, the varactor is the active device used to change the impedance match at a given frequency or range of frequencies. An example of a "Tee" network is shown on page 20-36 of the "Matching Network Designs with Computer Solutions" section of the 1980 Motorola RF Data Manual.

A combination of transmission line sections such as single, double and triple-stub tuners can also be used to match an impedance that is both resistive and reactive. This is accomplished by changing the length of these transmission lines. Techniques for matching transmission line stubs are known in the art, including those disclosed in pages 193 through 201 of "Transmission Lines and Networks," Walter C. Johnson, McGraw-Hill Book Company, Inc., 1980; and the use of a variable length transmission line for impedance matching is known in the art, as disclosed, for example, in commonly assigned U.S. Pat. 5,014,023, issued May 7, 1991 to Mantele for "NON-DISPERSIVE VARIABLE PHASE SHIFTER AND VARIABLE LENGTH TRANSMISSION LINE," incorporated herein by reference.

Figure 5:
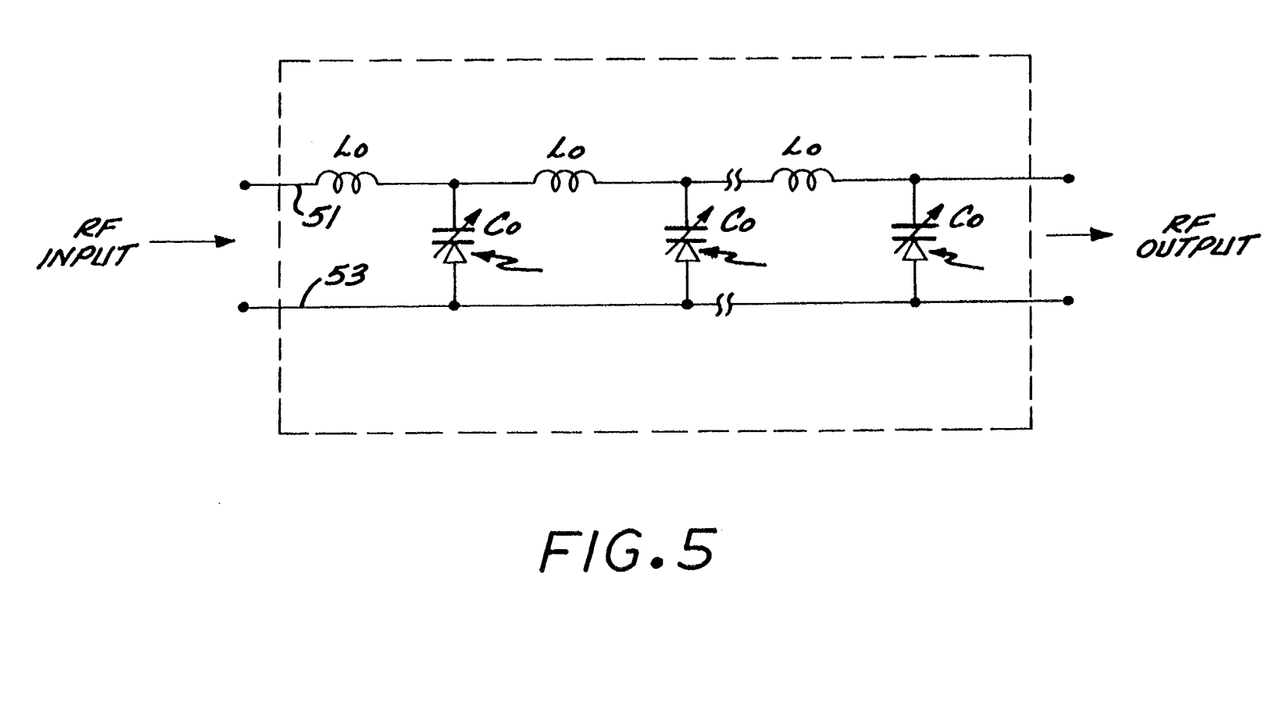
FIG. 5 is a simplified schematic diagram of a photonically controlled variable length transmission line that can be used for sections of a photonically controlled stub tuner utilized as a photonically controlled impedance matching circuit in the photonic impedance matching system of the invention.

Referring now to FIG. 5, set forth therein by way of illustrative example is a simplified schematic of a variable length distributed transmission line circuit that can be utilized for the sections of a combination of transmission line sections utilized as the impedance matching circuit in the circuits of FIGS. 1 through 4. The variable length distributed transmission line circuit includes first and second conductors 51, 53, and plurality of optically controlled varactor diodes $D_v$ connected across the conductors 51, 53. The distributed parameters of the transmission line are represented as inductors $L_D$, and the variable junction capacitances of the varactor diodes are depicted as variable capacitors $C_D$. The electrical length of the transmission line is varied by controlling the variable capacitances of the varactor diodes with light. The use of varactor diodes to control a variable length transmission line is known in the art as disclosed in the previously cited U.S. Pat. 5,014,023 which discloses voltage control of varactor diodes to change the length of the transmission line. Also, the use of light to control the capacitance of a varactor is also known in the art, as disclosed, for example, in the paper entitled "A HIGH-SPEED PHASE SHIFTER BASED ON OPTICAL INJECTION," L. R. Brothers Jr. and C. H. Cox, III, 1987 IEEE MTT-S Digest, pages 819-823, which is incorporated herein by reference.

The foregoing has been a disclosure of photonically controlled reconfigurable RF matching circuitry for RF electrical and photonic circuits which provide for optimal impedance matching (i.e., a low level of reflections), reduced insertion loss in comparison to conventional 50 ohm matching techniques (i.e., increased power transfer), and the capability for changing impedance and bandwidth characteristics.

Although the foregoing has been a description and illustration of specific embodiments of the invention, various modifications and changes thereto can be made by persons skilled in the art without departing from the scope and spirit of the invention as defined by the following claims.

What is claimed is:

1. An RF photonic impedance matching system for impedance matching the input of an RF circuit which provides an RF circuit electrical output, comprising:
   an RF photonically controlled impedance matching circuit having adjustable impedance and power transfer characteristics responsive to an RF electrical input for providing an RF matching circuit output to the input of the RF circuit;
   input detecting means for detecting said RF electrical input to provide an input reference signal;
   output detecting means for detecting the RF circuit electrical output of the RF circuit to provide an output reference signal;
   optical signal generating means for providing an optical signal to control said RF photonically controlled impedance matching circuit; and
   control means responsive to said input reference signal and said output reference signal for controlling said optical signal generating means such that said impedance matching circuit provides a desired impedance matching and power transfer relative to the RF circuit.

2. The RF photonic impedance matching circuit of claim 1 wherein said optical signal generating means comprises a laser diode.

3. An RF photonic impedance matching system for matching an electrical input of an RF optical circuit which provides an RF optical output, comprising:
   an RF photonically controlled impedance matching circuit having adjustable impedance and power transfer characteristics responsive to an RF electrical input for providing an RF matching circuit electrical output to the electrical input of the RF optical circuit;
   input detecting means for detecting said RF electrical input and providing an input reference signal;
   output detecting means for detecting the RF optical output of the RF optical circuit for providing an output reference signal;
   optical signal generating means for providing an optical matching circuit control signal to control said RF photonically controlled impedance matching circuit; and
   control means responsive to said input reference signal and said output reference signal for controlling said optical signal means such that said impedance matching circuit provides a desired impedance matching and power transfer relative to the RF optical circuit.

4. The RF photonic impedance matching circuit of claim 3 wherein said optical signal generating means includes a laser diode.

5. The RF photonic impedance matching circuit of claim 3 wherein said optical signal generating means includes an optical coupler responsive to the RF optical output of the RF optical circuit for providing an optical signal sample of the optical output of the RF optical circuit, and an optical control circuit responsive to said control means for controlling said optical signal sample to provide a controlled optical signal sample which is provided as said optical matching circuit control signal.

6. An RF photonic impedance matching system for impedance matching the output of an RF optical circuit which receives an RF optical input and provides an RF electrical output, comprising:
   an RF photonically controlled impedance matching circuit having adjustable impedance and power transfer characteristics responsive to the RF electrical output of the RF optical circuit for providing a matching circuit RF electrical output;

input detecting means for detecting the RF optical input to the RF optical circuit and providing an input reference signal;

output detecting means for detecting said matching circuit RF electrical output for providing an output reference signal;

optical signal generating means for providing an matching circuit optical control signal to control said RF photonically controlled impedance matching circuit; and control means responsive to said input reference signal and said output reference signal for controlling said optical signal generating means such that said impedance matching circuit provides a desired impedance matching and power transfer relative to the RF optical circuit.

* * * * *